United States Patent [19]

Mashima et al.

[11] Patent Number: 5,435,965
[45] Date of Patent: Jul. 25, 1995

[54] SPUTTERING TARGET AND METHOD FOR MANUFACTURING SAME

[75] Inventors: Munenori Mashima; Jun Tamura, both of Sanda, Japan

[73] Assignee: Mitsubishi Materials Corporation, Tokyo, Japan

[21] Appl. No.: 836,751

[22] Filed: Feb. 19, 1992

[30] Foreign Application Priority Data

Feb. 19, 1991 [JP] Japan ................... 3-024922

[51] Int. Cl.⁶ ............................................. B22F 7/04
[52] U.S. Cl. .......................................... 419/8; 419/49
[58] Field of Search ................................. 419/8, 49

[56] References Cited

U.S. PATENT DOCUMENTS 4,941,920  7/1990  Envi et al. ............................. 75/246
5,002,728  3/1991  Achikita et al. ....................... 419/23

OTHER PUBLICATIONS

Patent Abstracts of Japan, vol. 4, No. 101 (C-19) (583), Jul. 19, 1980, & JP-A-55-62164, May 10, 1980, Y. Itou, et al., "Sputtering Unit".
Patent Abstracts of Japan, vol. 14, No. 57 (C-684) (4000), Feb. 2, 1990, & JP-A-1-283367, Nov. 14, 1989, M. Mashima, et al., "Production of Targe for Sputtering".
Patent Abstracts of Japan, vol. 14, No. 211 (C-715) (4154), May 2, 1990, & JP-A-2-47261, Feb. 16, 1990, N. Hirao, "Silicide Target and Production Thereof".
Hirschhorn, Joel S., "Introduction to Powder Metallurgy", American Powder Met Institute, 1969, pp. 279–280.

*Primary Examiner*—Donald P. Walsh
*Assistant Examiner*—Daniel Jenkins
*Attorney, Agent, or Firm*—Oblon, Spivak, McClelland, Maier & Neustadt

[57] ABSTRACT

A sputtering target is disclosed which includes a backing member of a cylindrical shape and a target material bonded onto an outer peripheral surface of the backing member by hot isostatic pressing. A method for manufacturing a sputtering target is also disclosed. First, a cylindrical backing member is inserted into a mold such that a space is defined between the backing member and the mold. A target material is then filled into the space between the backing member and the mold, and the mold is sealed. Thereafter, the target material and the backing member are subjected to hot isostatic pressing.

4 Claims, 4 Drawing Sheets

SPUTTERING TARGET AND METHOD FOR MANUFACTURING SAME

BACKGROUND OF THE INVENTION

1. Field of the Invention

The present invention relates to a sputtering target having a target material joined onto an outer peripheral surface of a cylindrical backing member, and a method for manufacturing the same.

2. Prior Art

Conventional sputtering targets extensively in use are of a planer type having a circular or square plate-like shape. However, the targets of this type have the disadvantages that the amount of consumable target material is only about 30 to 40%, and that a continuous sputtering operation or sputtering onto an elongated substrate cannot be carried out. Therefore, targets of a cylindrical shape have recently come into use.

For manufacturing cylindrical targets, the following various methods are known:

(A) Plasma flame coating method:

This method involves flame-coating a target material on the outer peripheral surface of a backing tube using plasma jet generated in an atmosphere of an inert gas or in ambient air, to thereby produce a target of a cylindrical shape. This method has been applied in the manufacture of targets of Si (silicon), Cr (chromium), Sn (stannum or tin) or the like.

(B) Casting (Fusion) method:

This method involves forming a tubular mold around the periphery of a backing tube, and introducing a molten target material into the space between the backing tube and the mold, to thereby manufacture a cylindrical target. This method can be employed for manufacturing targets of metals having low melting points, e.g., Zn (zinc) or Sn.

(C) Flame coating method:

This method involves flame-coating a fused target material on the outer peripheral surface of a backing tube, using high pressure gas, to thereby manufacture a cylindrical target. This method may also be applied to the targets of metals with low melting points, such as Zn or Sn.

(D) Electroplating method:

This method involves immersing a backing tube in an electroplating bath so as to serve as a cathode, and depositing metal ions in the electrolyte, on the outer peripheral surface of the backing tube, to thereby manufacture a cylindrical target. This method is applied to the targets of Cr, Sn or the like.

The above various methods, however, have the following disadvantages:

In the plasma flame coating method, gas is easily occluded in the target, and the gas causes defects therein. Therefore, the resulting target comes to have a low density. In addition, a reaction layer may be formed between the target material and the backing tube.

Furthermore, the casting method has the disadvantages that its application is limited only to the metals with low melting points such as Zn, Sn or the like, and that the resulting target is susceptible to casting defects.

On the other hand, in the flame coating method, the temperature of the melt can be controlled so as to be constant, and therefore targets with less defects can be obtained. However, this method is still only applicable to the metals with low-melting points, and a large-scale facility is required, so that the manufacturing costs of targets are unduly increased.

Moreover, in the electroplating method, although the target material strongly adheres to the backing tube, it takes a prolonged period of time for metal ions to be deposited, and the thicknesses of the resulting targets are limited.

As described above, the known methods have various disadvantages. Therefore, cylindrical targets of Cr, Mo (molybdenum) or the like manufactured by a powder molding method have been employed in practice.

FIG. 3 depicts an example of such a cylindrical target 1 manufactured by the conventional powder molding method. This target 1 includes a cylindrical target material 2 and a backing tube 4 of stainless steel inserted into a hollow portion 3 thereof, and solder material 5 is filled into the space between the target material 2 and the backing tube 4 to join them together. The target of this construction is consumed at a high ratio of 80 to 90%, and a glass surface or a mirror surface can be sputtered uniformly over its wide area using this target. Therefore, the field of application of this type of target would be widened in the future.

This cylindrical target 1 is usually manufactured according to the following method.

First, a material powder for targets is introduced into a cylindrical stainless steel can (mold), which is then sealed. Subsequently, hot isostatic pressing is carried out to provide a cylindrical sintered body 11 (see FIG. 4(a)), and the resulting sintered body 11 is machined into a cylindrical target material 2 (see FIG. 4(b)). Thereafter, the solder material 5 is filled into the space between the target material 2 and the backing tube 4 to join them together (see FIG. 4(c)).

In the aforesaid method for manufacturing the target 1, since the sintered body 11 is machined into a cylindrical shape, it is very difficult to work its inner surface, resulting in a large loss of material. Furthermore, inasmuch as the method involves the steps of inserting the backing tube 4 into the hollow portion 3 of the target material 2, and filling the space between the target material 2 and the backing tube 4 with the solder material 5, it is very difficult to align the backing tube 4 with the target material 2, and additionally high precision must be attained with respect to diameters of these members. Furthermore, since the target material 2 and the backing tube 4 are joined together through the solder material 5, bonding strength is weak.

SUMMARY OF THE INVENTION

It is therefore a primary object of the present invention to provide a sputtering target which does not possess the aforesaid disadvantages.

Another object of the invention is to provide a manufacturing method which is specifically adapted to fabricate the aforesaid sputtering target.

According to a first aspect of the invention, there is provided a sputtering target comprising a backing member of a cylindrical shape and a target material directly bonded onto an outer peripheral surface of the backing member by hot isostatic pressing.

With this construction, the density of the target material as well as its mechanical strength are enhanced, and the occurrence of defects is reduced. In addition, the bonding strength between the backing member and the target material can be enhanced, and solder is not required therebetween. In the foregoing, it is preferable that the backing member be of a tubular shape.

According to another aspect of the invention, there is provided a method for manufacturing a sputtering target comprising the steps of:

inserting a cylindrical backing member into a mold such that a space is defined between the backing member and the mold;

subsequently filling a target material into the space between the backing member and the mold, and sealing the mold; and subsequently subjecting the target material and the backing member to hot isostatic pressing.

With these procedures, the bonding strength between the backing member and the target member can be enhanced, and the cooling effect can be improved. In addition, the machining work of the target member as well as the delicate aligning work of the backing member and the target material are not required. Therefore, the working process can be simplified, and the number of the processing steps can be reduced. In the foregoing, when the backing member is formed into a tubular shape, the step of machining the backing member into a tubular shape can be further omitted.

Furthermore, the reason the hot isostatic pressing is used is that with this procedure, the bonding strength between the target material and the outer peripheral surface of the backing member is enhanced, and additionally targets of high density and strength with less defects can be obtained.

DESCRIPTION OF THE PREFERRED EMBODIMENTS OF THE INVENTION

Figure 1:
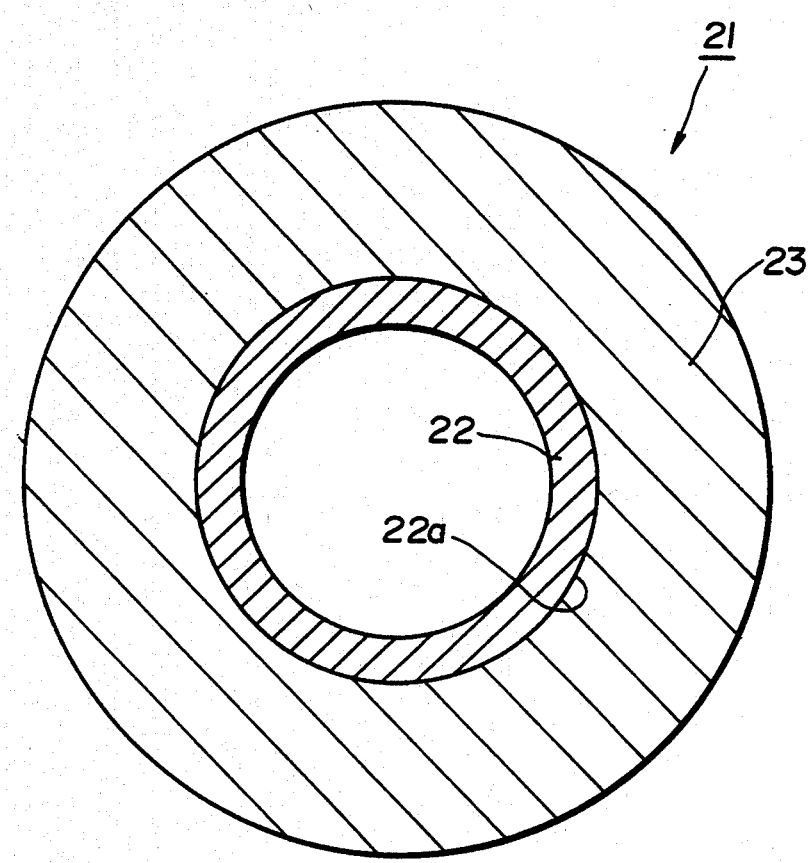
FIG. 1 is a cross-sectional view of a sputtering target in accordance with the present invention.

FIG. 1 is a cross-sectional view of a cylindrical sputtering target in accordance with an embodiment of the invention. This target, generally designated by 21, includes a cylindrical backing tube (backing member) 22 of stainless steel and a target material 23 joined on an outer peripheral surface 22a of the backing tube 22 so as to be coaxial therewith, by means of hot isostatic pressing. It is preferable that the target material 23 be a metal such as Cr, Mo, Ti (titanium), W (tungsten) or the like.

Next, a method for manufacturing the above sputtering target will be described with reference to FIG. 2.

Figure 2A:
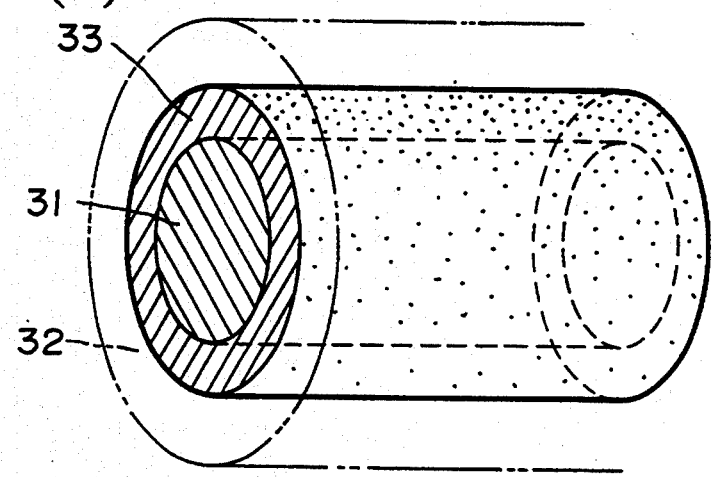
FIGS. 2(a) to 2(c) are perspective views showing manufacturing steps for producing the sputtering target of the invention.
Figure 2B:
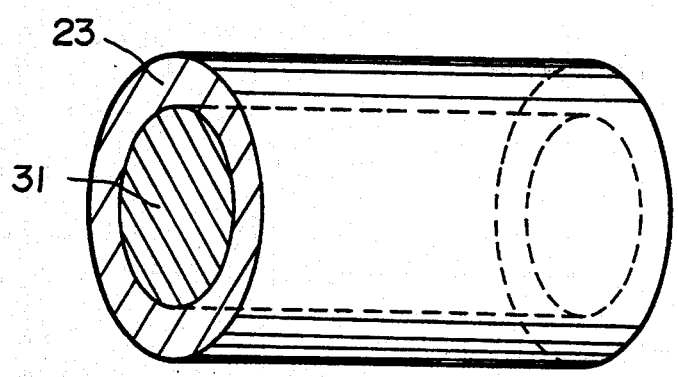
Figure 2C:
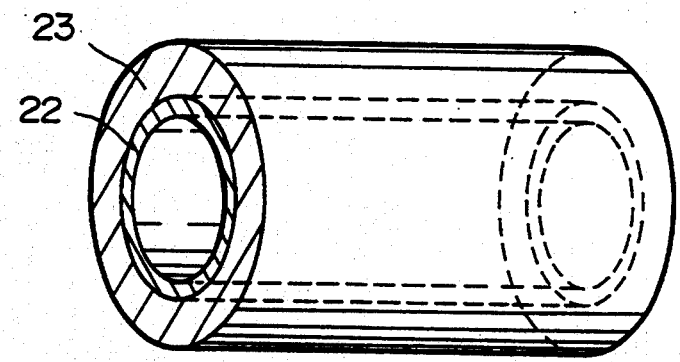
Figure 3:
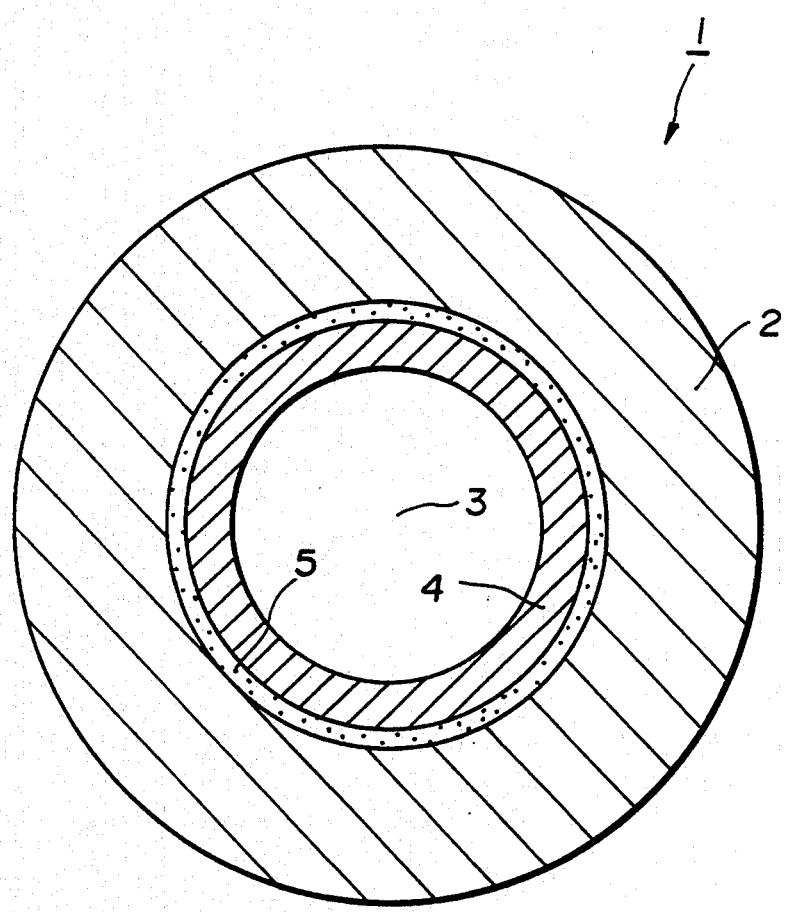
FIG. 3 is a cross-sectional view of a prior art sputtering target.
Figure 4A:
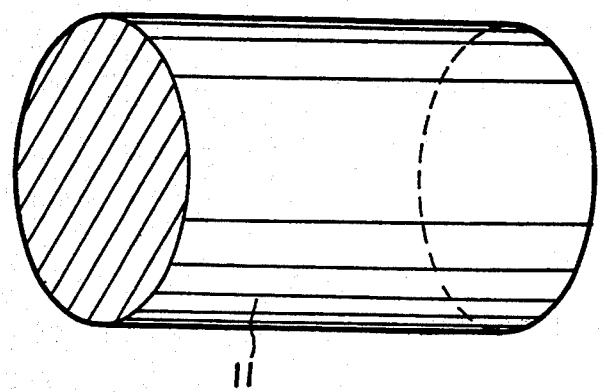
FIGS. 4(a) to 4(c) are views similar to FIGS. 2(a) to 2(c), but showing the steps for manufacturing the prior art target of FIG. 3.
Figure 4B:
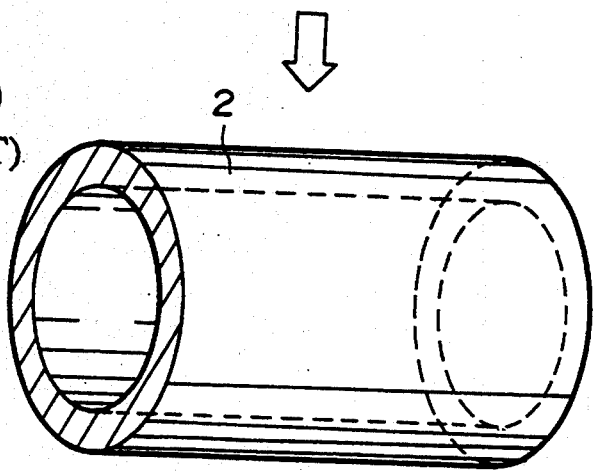
Figure 4C:
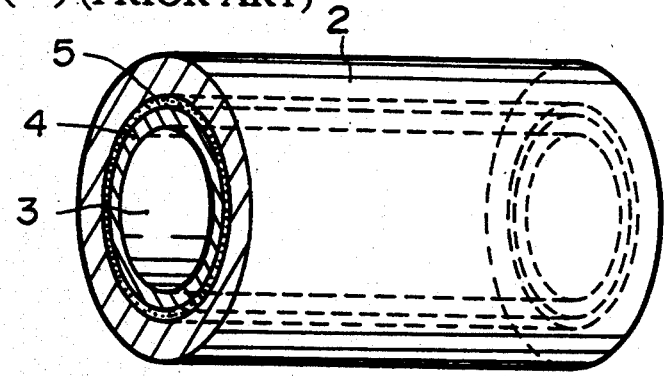

First, a cylindrical solid backing member 31 of stainless steel is inserted into a cylindrical stainless steel can (mold) 32, and a target raw material 33 is filled into the space between the backing member 31 and the stainless steel can 32 (see FIG. 2(a)). Then, the stainless steel can 32 is sealed and a hot isostatic pressing operation is carried out at a temperature of 1200° C. to 1400° C. under a pressure of 0.8 to 1.0 tons/cm$^2$ for a prescribed period of time. With these procedures, the target raw material 33 was sintered into a target material 23 (see FIG. 2(b)). Subsequently, the central portion of the backing member 31 is removed by a machining work, and a cylindrical backing tube 22 is obtained (see FIG. 2(c)).

Thus, the target 21, in which the target material 23 is bonded to the outer peripheral surface 22a of the backing tube 22 so as to be coaxial therewith, is produced.

As described above, in the sputtering target 21 of the present embodiment, the target material 23 is bonded to the outer peripheral surface 22a of the cylindrical backing tube 22 of stainless steel. Therefore, the density of the target material 23 itself as well as its mechanical strength can be substantially enhanced, and the occurrence of internal defects can be avoided. Furthermore, the bonding strength between the backing tube 22 and the target material 23 is substantially enhanced, and hence cooling efficiency can be greatly improved. Furthermore, there is no restriction on the thickness of the target material 23.

Moreover, according to the manufacturing method described above, the bonding strength between the backing tube 22 and the target material 23 can be enhanced. In addition, since the machining work of the target material 23 is not required, it is not necessary to align the target material 23 and the backing tube 22, so that the working steps can be reduced and simplified. Accordingly, a substantial reduction in manufacturing cost can be attained.

In the foregoing, if the backing member is of a tubular shape, it is not necessary to machine the backing member into tube, so that the working steps can further be simplified.

The present invention will now be illustrated by the following example:

EXAMPLE

According to the procedures as described above in conjunction with FIG. 2, a sputtering target of the invention was actually manufactured.

More specifically, a cylindrical stainless steel can 32a and a cylindrical solid backing member 31 of stainless steel were prepared, and the backing member was inserted into the can 32a. Then, as a target raw material 33, Cr metal powder was filled into the space between the backing tube 31 and the stainless steel can 32. Then, the stainless steel can 32 was sealed and hot isostatic pressing was carried out at a temperature of 1200° C. under a pressure of 1.0 tons/cm$^2$ for one hour. With these procedures, the target raw material 33 was sintered into a target material 23 (see FIG. 2(b)). Subsequently, the central portion of the backing member 31 was removed, and a cylindrical backing tube 22 was produced (see FIG. 2(c)). Thus, the target 21 of the invention was produced.

Furthermore, for comparison purposes, a comparative target was prepared according to the prior art method.

Table 1 depicts a comparison between the target 21 of the invention and the comparative target. As will be clearly seen from Table 1, the target of the invention exhibits superior performance compared with the comparative target as to both tensile strength and output power until the separation of the target material. Accordingly, in the target of the invention, the density and mechanical strength of the target material are enhanced, and the occurrence of internal defects is avoided. Furthermore, the bonding strength between the backing tube and the target material is enhanced.

Furthermore, Table 2 depicts a comparison between the method of the invention and the prior art method using soldering, in which the kinds of working steps after the hot isostatic pressing operation are listed.

As will be clearly seen from Table 2, in the method of the invention, the number of the working steps is substantially reduced compared with the prior art method. In addition, the working operation at each step is simplified.

TABLE 1

Comparison of Bonding Strength

| Target | Tensile strength | Output power until the separation |
|---|---|---|
| Target of the invention | 400 kg/mm$^2$ | no less than 50 KW |
| Comparative target | 150 kg/mm$^2$ | 3 KW |

TABLE 2

Comparison of Processing Steps

| Target | Processing steps after hot isostatic pressing |
|---|---|
| Target of the invention | Processing of outer peripheral surface of target Processing of the inner surface of backing tube |
| Comparative target | Processing of the inner surface of target material Processing of the outer surface of target material Processing of the inner surface of backing tube Processing of the outer surface of backing tube Bonding work |

What is claimed is:

1. A method for manufacturing a sputtering target comprising the steps of:
    inserting a cylindrical backing member into a mold such that a space is defined between said backing member and said mold;
    subsequently filling a target material into said space between the backing member and the mold, and sealing said mold; and
    subsequently subjecting the target material and the backing member to hot isostatic pressing.

2. A method for manufacturing a sputtering target as recited in claim 1, wherein said cylindrical backing member is of a tubular shape.

3. The method of claim 1, wherein said mold has a cylindrical opening, and wherein the step of filling a target material includes filling the target material into the space between the backing member and the mold such that the target material is directly in contact with the backing member.

4. The method of claim 3, wherein the step of subjecting the target material and the backing member to hot isostatic pressing includes performing the hot isostatic pressing operation at a temperature of 1200° C. to 1400° C., and a pressure of 0.8 to 1.0 tons/cm$^2$.

* * * * *